(12) United States Patent
Aleksov et al.

(10) Patent No.: US 10,327,330 B2
(45) Date of Patent: Jun. 18, 2019

(54) STRETCHABLE ELECTRONIC ASSEMBLY

(71) Applicant: Intel Corporation, Santa Clara, CA (US)

(72) Inventors: Aleksandar Aleksov, Chandler, AZ (US); Adel A. Elsherbini, Chandler, AZ (US); Javier Soto Gonzalez, Chandler, AZ (US); Dilan Seneviratne, Phoenix, AZ (US); Shruti R. Jaywant, Chandler, AZ (US); Sashi S. Kandanur, Chandler, AZ (US); Srinivas Pietambaram, Gilbert, AZ (US); Nadine L. Dabby, Palo Alto, CA (US); Braxton Lathrop, Lake Oswego, OR (US); Rajat Goyal, Chandler, AZ (US); Vivek Raghunathan, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/762,791

(22) PCT Filed: Sep. 24, 2015

(86) PCT No.: PCT/US2015/052073
§ 371 (c)(1),
(2) Date: Mar. 23, 2018

(87) PCT Pub. No.: WO2017/052567
PCT Pub. Date: Mar. 30, 2017

(65) Prior Publication Data
US 2018/0295720 A1    Oct. 11, 2018

(51) Int. Cl.
*H05K 1/02* (2006.01)
*H01L 23/14* (2006.01)
(Continued)

(52) U.S. Cl.
CPC ......... *H05K 1/0283* (2013.01); *H01L 23/145* (2013.01); *H01L 23/5387* (2013.01);
(Continued)

(58) Field of Classification Search
CPC .......................... H05K 1/0283; H05K 1/038
(Continued)

(56) References Cited

U.S. PATENT DOCUMENTS 6,341,504 B1    1/2002  Istook
9,378,450 B1*   6/2016  Mei ..................... G06K 19/0776
(Continued)

FOREIGN PATENT DOCUMENTS

WO    WO-2010086416 A1    8/2010
WO    WO-2017052567 A1    3/2017

OTHER PUBLICATIONS

"International Application Serial No. PCT/US2015/052073, International Search Report dated Jun. 13, 2016", 3 pgs.
(Continued)

*Primary Examiner* — Sherman Ng
(74) *Attorney, Agent, or Firm* — Schwegman Lundberg & Woessner, P.A.

(57) ABSTRACT

Some forms relate to an example stretchable electronic assembly. The stretchable electronic assembly includes a stretchable body that includes electronic components. A plurality of meandering conductors electrically connect the electronic components. The plurality of meandering conductors may be exposed from the stretchable body. A plurality of conductive pads are electrically connected to at least one of the electronic components or some of the plurality of meandering conductors. The plurality of conductive pads may be exposed from the stretchable body. The stretchable body includes an upper surface and lower surface. The plurality of meandering conductors may be exposed from
(Continued)

the lower surface (in addition to, or alternatively to, the upper surface) of the stretchable body.

18 Claims, 17 Drawing Sheets

(51) Int. Cl.
| | | |
|---|---|---|
| H01L 23/538 | (2006.01) | |
| H05K 1/03 | (2006.01) | |
| H05K 1/11 | (2006.01) | |
| H05K 1/18 | (2006.01) | |
| H05K 3/00 | (2006.01) | |
| H05K 3/18 | (2006.01) | |
| H05K 3/28 | (2006.01) | |
| H05K 3/34 | (2006.01) | |
| H05K 3/42 | (2006.01) | |
| H05K 3/46 | (2006.01) | |
| H05K 3/20 | (2006.01) | |

(52) U.S. Cl.
CPC .............. *H05K 1/038* (2013.01); *H05K 1/111* (2013.01); *H05K 1/189* (2013.01); *H05K 3/0023* (2013.01); *H05K 3/0047* (2013.01); *H05K 3/0052* (2013.01); *H05K 3/0055* (2013.01); *H05K 3/18* (2013.01); *H05K 3/284* (2013.01); *H05K 3/341* (2013.01); *H05K 3/429* (2013.01); *H05K 3/4661* (2013.01); *H05K 3/4682* (2013.01); *H05K 3/205* (2013.01); *H05K 2201/0133* (2013.01); *H05K 2201/0329* (2013.01); *H05K 2201/09263* (2013.01); *H05K 2201/10098* (2013.01); *H05K 2201/10151* (2013.01); *H05K 2203/1316* (2013.01); *H05K 2203/1327* (2013.01)

(58) Field of Classification Search
USPC .......................................... 174/254; 361/749
See application file for complete search history.

(56) References Cited

U.S. PATENT DOCUMENTS

| | | | |
|---|---|---|---|
| 2002/0094701 A1* | 7/2002 | Biegelsen | B25J 13/084 |
| | | | 439/32 |
| 2005/0280138 A1 | 12/2005 | Shrivastava | |
| 2008/0257589 A1* | 10/2008 | Ostmann | H05K 1/0271 |
| | | | 174/254 |
| 2012/0244848 A1 | 9/2012 | Ghaffari et al. | |
| 2013/0170158 A1* | 7/2013 | Van Abeelen | H05K 1/0283 |
| | | | 361/749 |
| 2014/0104793 A1* | 4/2014 | Park | H05K 1/0283 |
| | | | 361/749 |
| 2014/0374872 A1 | 12/2014 | Rogers et al. | |
| 2015/0216037 A1* | 7/2015 | Tomita | H01L 24/19 |
| | | | 174/251 |
| 2016/0270223 A1* | 9/2016 | Cherenack | H05K 1/0283 |

OTHER PUBLICATIONS

"International Application Serial No. PCT/US2015/052073, Written Opinion dated Jun. 13, 2016", 10 pgs.

* cited by examiner

PEELABLE CORE + LITHO

PLATE Cu/Ni/Cu (OR Au/Ni/Cu
OR Cu/Au/Ni/Cu) + STRIP RESIST

+ LAMINATE FLEXIBLE BF + DRILL VIAS + Pd/Au SF

COMPONENTS ATTACH

ELASTOMER MOLD

+ PEEL + COPPER, ETC...

PEELABLE CORE + LITHO

PLATE Cu/Ni/Cu (OR Au/Ni/Cu
OR Cu/Au/Ni/Cu) + STRIP RESIST

+ LAMINATE LET7 + DRILL VIAS + Pd/Au SF

LAM DFR + LITHO + DEV

DIELECTRIC REMOVAL: WET BLAST OR RIE

+ RESIST STRIP

COMPONENTS ATTACH

ELASTOMER MOLD

+ PEEL + COPPER, ETC...

STRETCHABLE ELECTRONIC ASSEMBLY

CROSS-REFERENCE TO RELATED APPLICATION

This application is a U.S. National Stage Filing under 35 U.S.C. 371 from International Application No. PCT/US2015/052073, filed on Sep. 24, 2015, and published as WO 2017/052567, which application is incorporated herein by reference in its entirety.

TECHNICAL FIELD

Embodiments described herein generally relate to an electronic assembly, and more particularly to a stretchable electronic assembly.

BACKGROUND

Stretchable electronic assemblies enable various approaches to managing different types of applications where computing power may be utilized to enhance the application. Sometimes the size and/or the shape of a device make it challenging to provide input (e.g., from a sensor) into a stretchable electronic assembly. Healthcare and fitness are examples of just a couple of applications that may utilize stretchable electronic assemblies.

One class of stretchable electronic assemblies that is rising in importance relates to textiles which include integrated electronic devices. There may be a variety of operational and manufacturing concerns associated with incorporating integrated electronic devices that are part of electronic packages or electronic systems into textiles that are meant to be worn on the body.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

In some forms, the example stretchable electronic assemblies described herein may be integrated with (or attached to) textiles (i.e. clothing). In other forms, the example stretchable electronic assemblies may be attached directly to the skin of someone (i.e., similar to a bandage) that utilizes any of the example stretchable electronic assemblies described herein.

As used herein "stretchable" refers to the ability elongate in the direction of an applied force. The amount of stretching will be determined in part on the application where any of the example stretchable electronic assemblies described herein are to be used. As an example, the degree of stretching may be different when the example stretchable electronic assemblies described herein are integrated with (or detachably connected to) textiles (i.e. clothing) as opposed when the example stretchable electronic assemblies described herein are attached directly to the skin of someone that utilizes any of the example wearable electronic assemblies.

Figure 1:
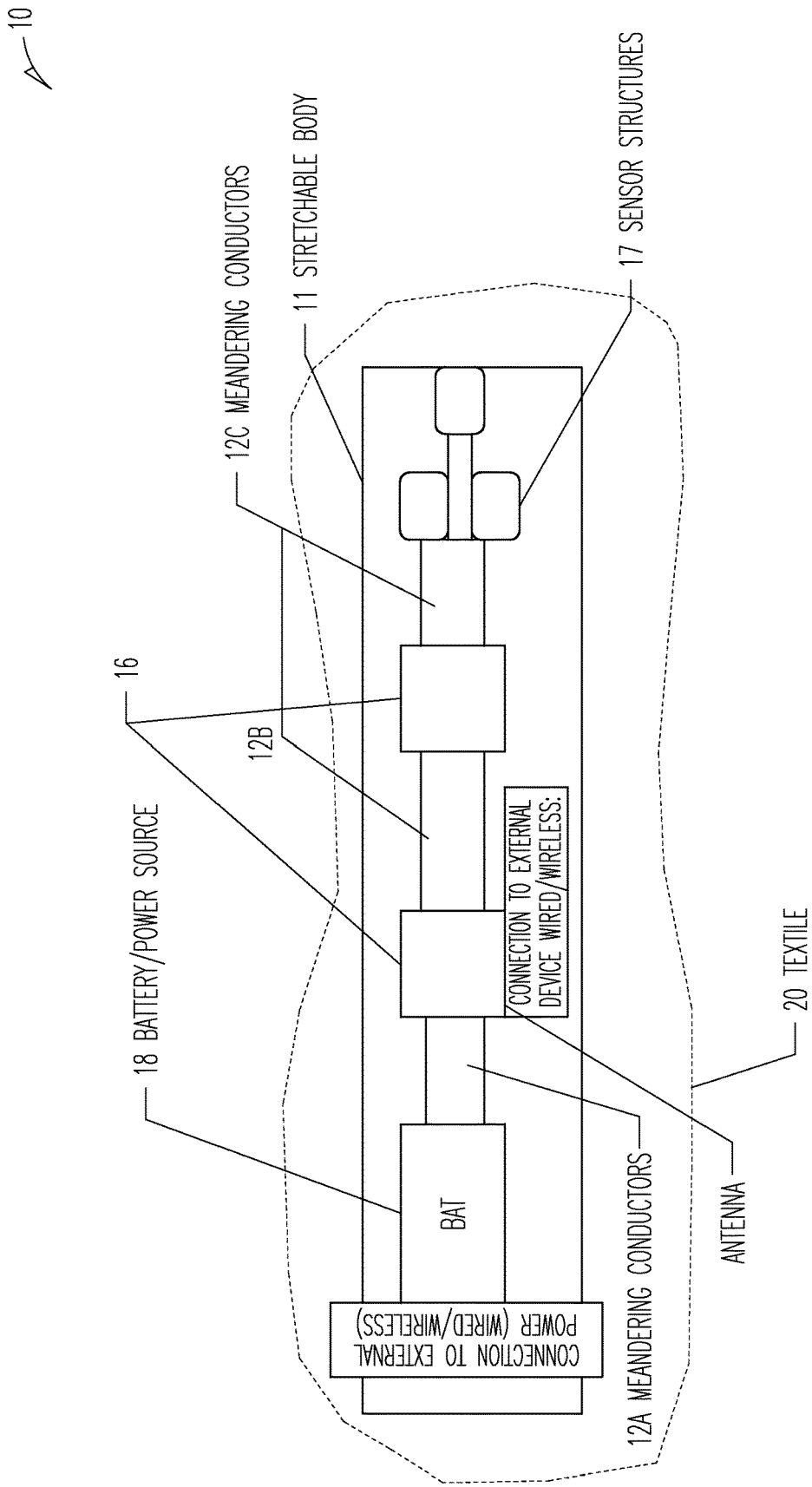
FIG. 1 is a schematic top view illustrating an example stretchable electronic assembly.

FIG. 1 is a schematic top view illustrating an example stretchable electronic assembly 10. The stretchable electronic assembly 10 includes a stretchable body 11 that includes electronic components. A plurality of meandering conductors 12A, 12B, 12C electrically connect the electronic components. The plurality of meandering conductors 12A, 12B, 12C may be exposed from the stretchable body 11.

A plurality of conductive pads are electrically connected to at least one of the electronic components or some of the plurality of meandering conductors 12A, 12B, 12C. The plurality of conductive pads may be exposed from the stretchable body 11.

As shown in FIGS. 2-5, the stretchable body 11 includes an upper surface 14 and lower surface 15. The plurality of meandering conductors 12A, 12B, 12C may be exposed from the lower surface 15 (in addition to, or alternatively to, the upper surface 14) of the stretchable body 11. In addition, the plurality of conductive pads may be exposed from the lower surface 15 (in addition to, or alternatively to, the upper surface 14) of the stretchable body 11. It should be noted that the meandering conductors 12 and the conductive pads are only shown as being exposed from the lower surface 15 of the stretchable body 11 in FIGS. 2-5.

In some forms, at least one of the electronic components is an electronic package 16. Alternatively, or in addition to, at least one of the electronic components may be a sensor 17. In addition, at least one of the electronic components may be a power source 18.

Figure 5:
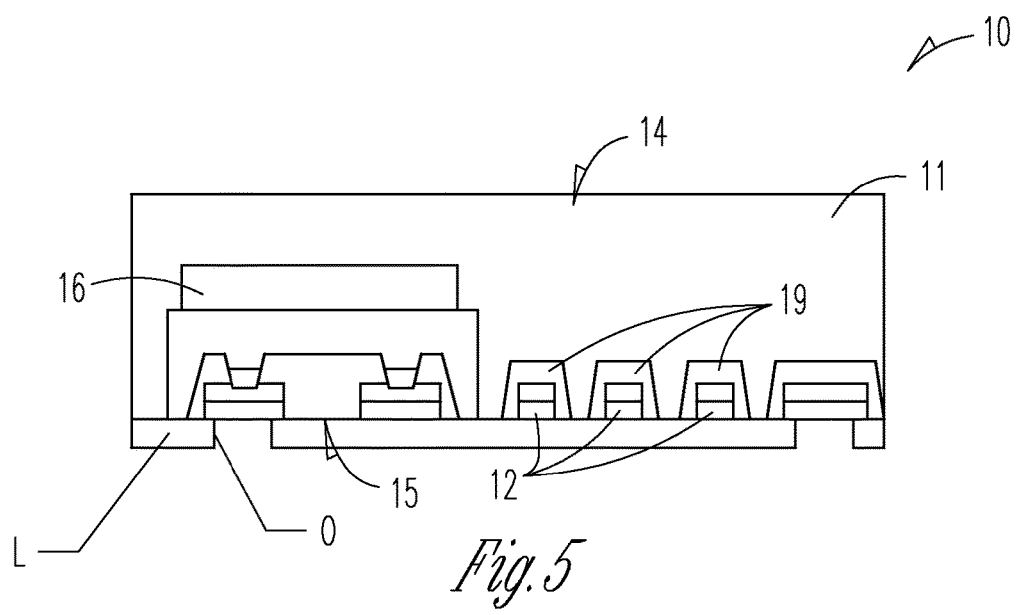
FIG. 5 shows the stretchable electronic assembly of FIG. 4 where a patterned layer has been added to a bottom surface of the stretchable electronic assembly.
Figure 6:
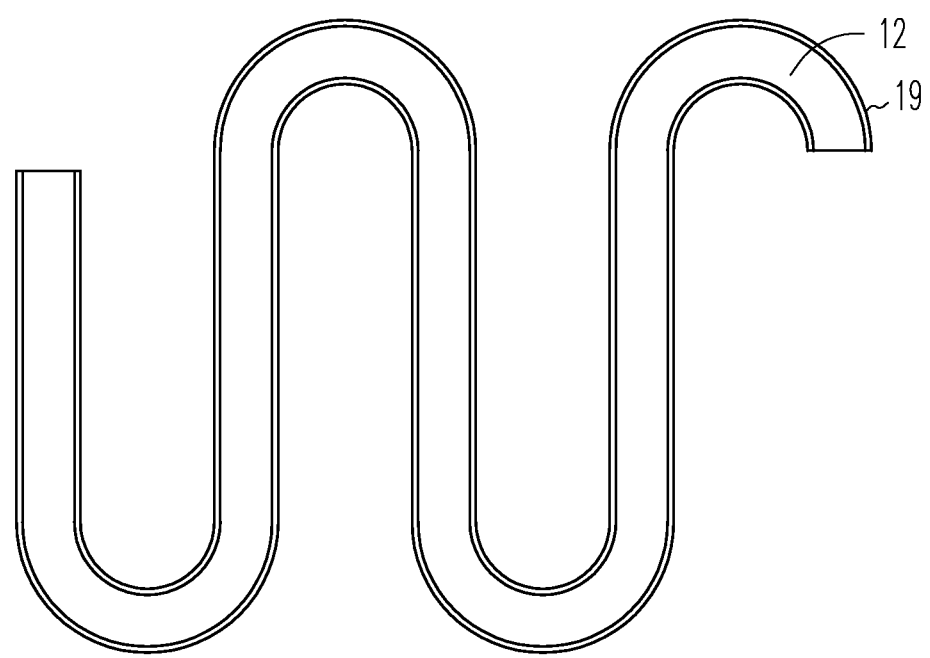
FIG. 6 shows a top view of an example meandering trace that may be used in any of the stretchable electronic assemblies described herein.
Figure 7:
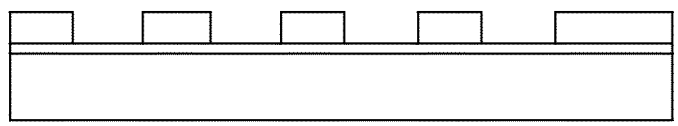
FIGS. 7-12 show schematic side views at distinctive stages of manufacturing for various example processes of forming stretchable electronic assemblies.
Figure 7:
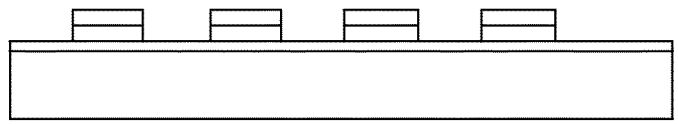
Figure 7:
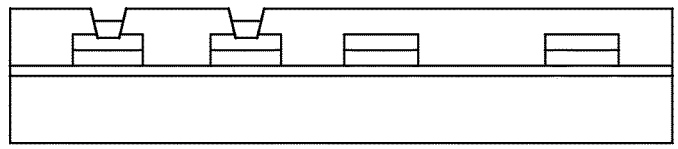
Figure 7:
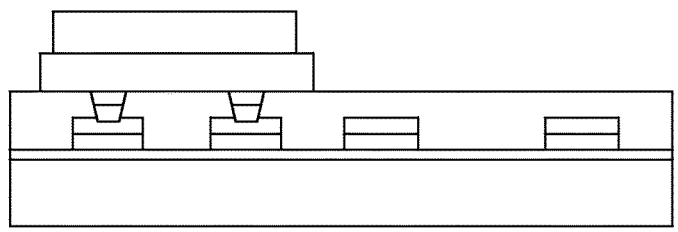
Figure 7:
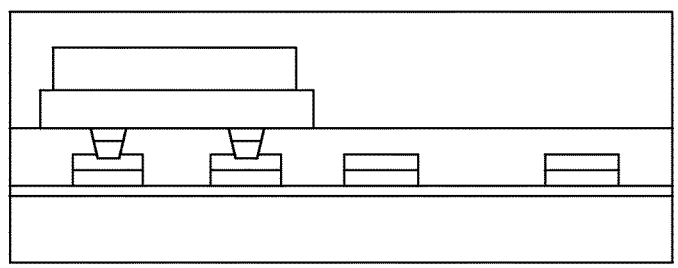
Figure 7:
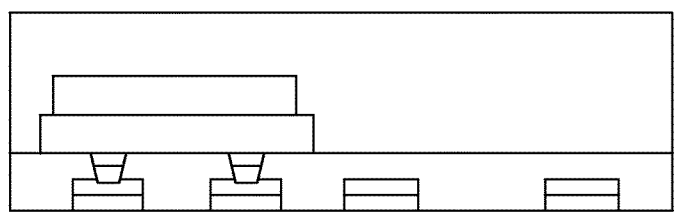
Figure 8:
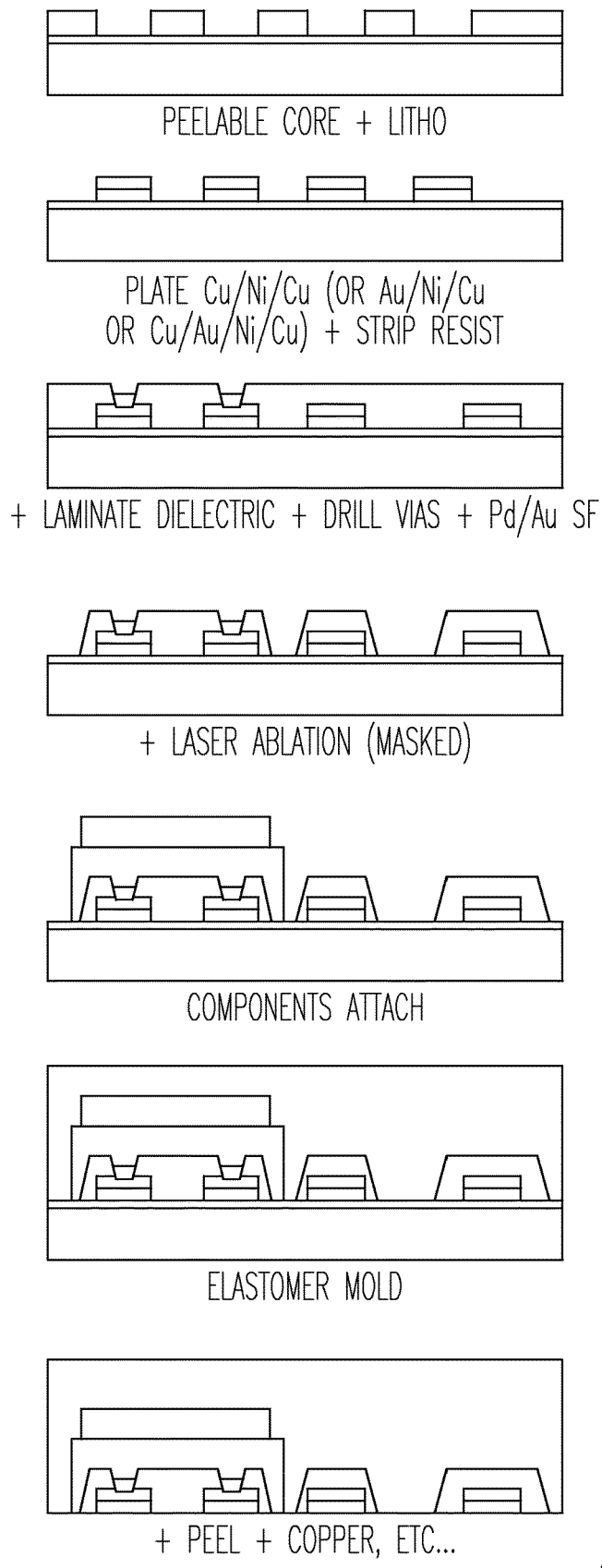
Figure 9:
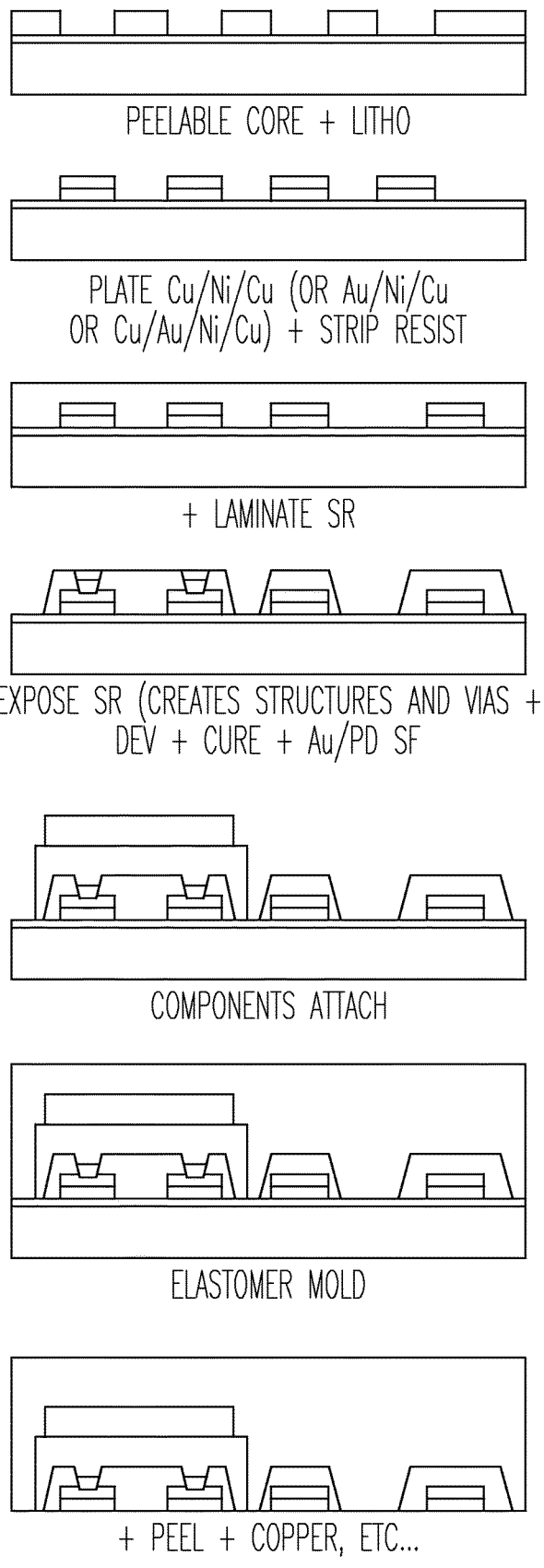
Figure 10:
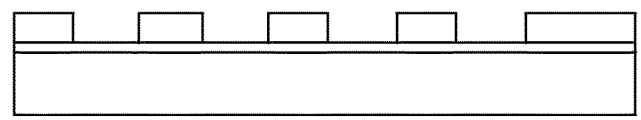
Figure 10:
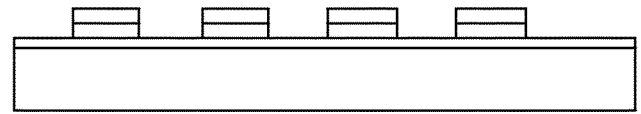
Figure 10:
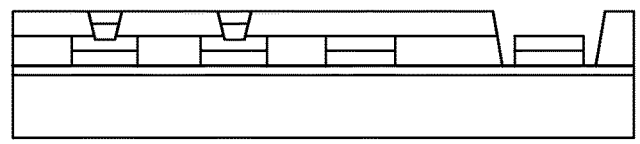
Figure 10:
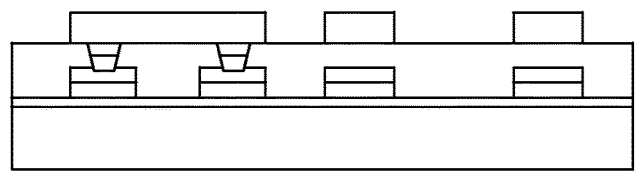
Figure 10:
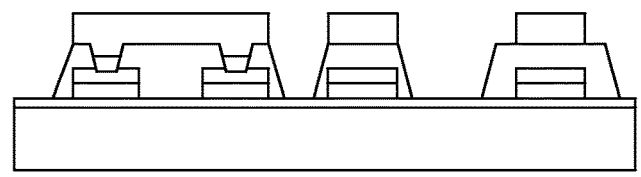

As shown in FIG. 6, the meandering conductors 12 may have a modified sinusoidal shape. It should be noted that the meandering conductors 12 may have a variety of shapes, including but not limited to, meandering conductors that are known now, or developed in the future. In the example meandering conductor 12 shown in FIGS. 4-6, the meandering conductor is covered with a stretchable dielectric material 19. The type of material 19 that covers the meandering conductor 12 will depend in part on manufacturing concerns as well as the degree of flexibility that is required of the meandering conductor 12. As an example, the flexible material 19 that covers the meandering conductor 12 may be as example polyimide, epoxy, epoxy and/or polyimide filled with various micro and/or nano fillers, such as silica particles and acrylate.

In some example forms, at least one of the electronic components may send wired or wireless signals to a user interface (not shown). As an example, at least one of the electronic components may include (or be attached to) an antenna that sends and receives wireless signals to an external device.

The stretchable electronic assembly 10 may further include a textile 20. The stretchable body 11 may be attached to the textile 20 in any manner that is known now or discovered in the future. The type of textile 20 that is attached to the electronic assembly 10 will depend on in part on the application where the stretchable electronic assembly 10 is to be used (among other factors).

The example stretchable electronic assembly 10 described herein may permit the use of high volume manufacturing processes that permit the stretchable electronic assemblies 10 to be incorporated into various textiles, garments, clothes, etc., or directly onto the human body. In addition, the example stretchable electronic assemblies 10 described herein may allow a designers to provide for an electronic device that includes highly dense electronic systems as well as allow for easy hardware programming access. The example electronic assemblies may also allow for easy and seamless integration into a garment based sensor network as well as fabricating self-contained systems for patches that are placed directly on the skin.

In some example forms, the example electronic assembly 10 includes rigid areas that contain electronic components that are used for various functions such as computation, communication, sensor access and driving, power management and power sources (among other types of functions). These rigid areas may be connected by stretchable copper-based interconnects (e.g., meandering conductors 12). In addition, the example stretchable electronic assembly 10 may include different types of pads for connectivity to additional sensors or power sources as well as potentially permit wireless connectivity using various antenna designs. As an example, different antennas may be used for wireless charging and communication.

It should be noted that various types of sensors 17 may be connected to the stretchable body 11, or the stretchable body 11 may include components that permit electrical connection to various types of sensors 17. The types of sensors that are included in the stretchable electronic assembly 10 will depend in part on the application where the stretchable electronic assembly 10 is to be used (among other factors).

It should be noted that any of the electronic components that are included in the electronic assembly 10 may be attached by various attachment methods (e.g., soldering). A variety of other attachment methods are contemplated including the use of ACF, ACP, self-assembled solder joint pastes and other attachment methods known in the art.

The stretchable electronic assemblies 10 described herein may significantly improve IO density between any of the components that are included in the stretchable electronic assembly 10. Improving the IO density may increase the functionality and flexibility in textile-related computing devices. The use of meandering conductors may limit the pitch between traces. As an example, a 1 to 10 ratio of trace widths to meandering amplitude may be used. In some forms, the trace widths may be as low as 20 micrometers depending on various manufacturing considerations.

Figure 2:
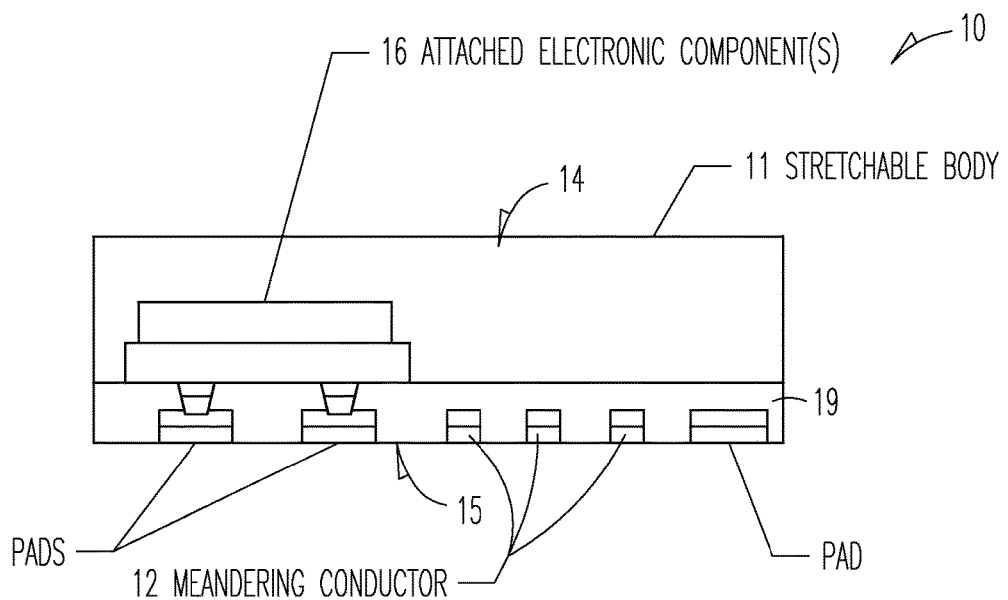
FIG. 2 is a schematic side view illustrating another example stretchable electronic assembly.
Figure 3:
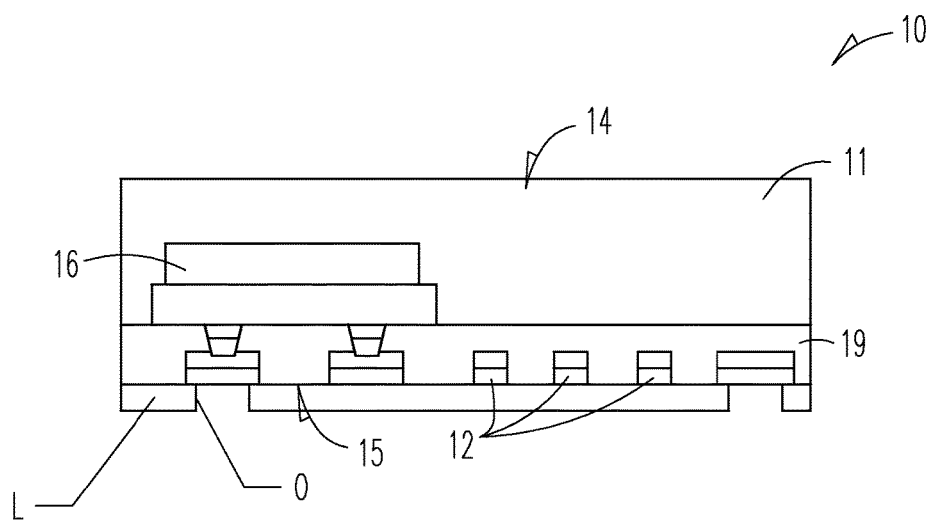
FIG. 3 shows the stretchable electronic assembly of FIG. 2 where a patterned layer has been added to a bottom surface of the stretchable electronic assembly.

FIG. 2 is a schematic side view illustrating another example stretchable electronic assembly 10. FIG. 3 shows the stretchable electronic assembly of FIG. 2 where a pattern layer L has been added to a bottom surface of the stretchable electronic assembly.

The example stretchable electronic assembly 10 shown in FIGS. 2 and 3 may allow for easy access to the meandering conductors 12 from the lower side 15 of the stretchable electronic assembly 10 after the stretchable electronic assembly 10 has been encapsulated. In addition, the meandering conductors 12 may be encapsulated by a dielectric 19 (see FIGS. 4-6) for improved reliability (as discussed above). As shown in FIGS. 2 and 3, the dielectric 19 may form a layer that includes the meandering conductors 12. This easy access to the meandering conductors 12 may allow for easy programming access as well as for easy integration to traces that are part of textiles (e.g., garments).

Figure 4:
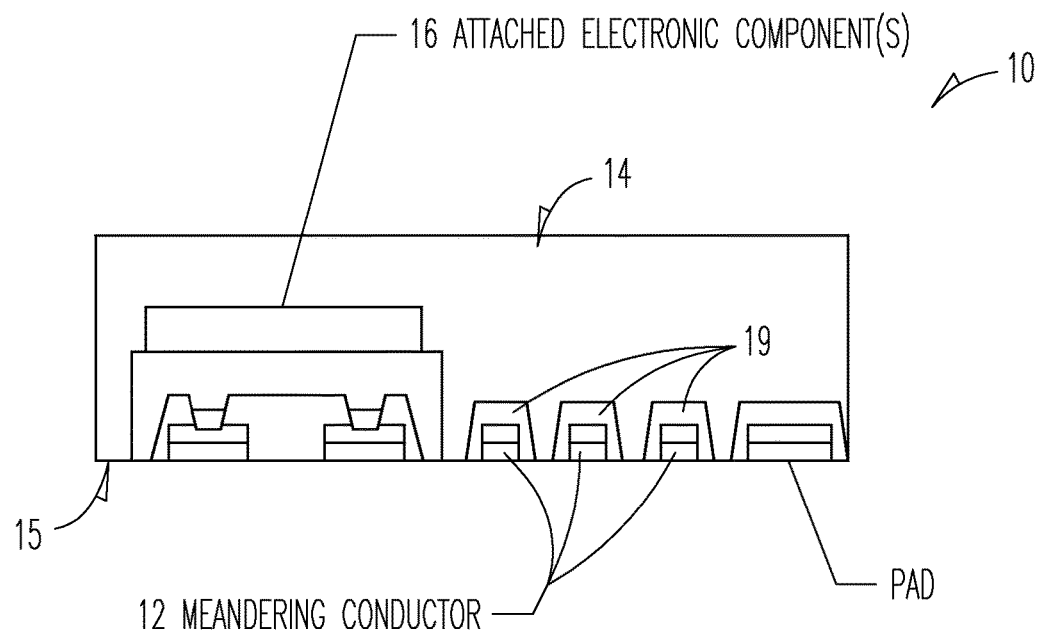
FIG. 4 is a schematic side view illustrating still another example stretchable electronic assembly.

FIG. 4 is a schematic side view illustrating still another example stretchable electronic assembly 10. FIG. 5 shows a stretchable electronic assembly 10 of FIG. 4 where a pattern layer L has been added to a lower surface 15 of the stretchable electronic assembly 10.

As shown in FIGS. 4 and 5 the components that perform computational functions within the stretchable electronic assembly 10 may be a single component, such as a dye, passive component, sensor or electronic package. In alternative forms, the electronic component may be formed of several components.

In some forms, the electronic components may be attached in different manners and possibly include an underfill depending on how the electronic components are attached to the stretchable body 11. In addition the various electronic components may be encapsulated with an elastomer that may be integrated during manufacturing or after being released from a temporary carrier panel (see FIG. 12). In some forms, the stretchable electronic assemblies 10 described herein may include openings O that are formed by a variety of methods (e.g., laser drilling) in order to permit programming and connectivity access to the various components and the stretchable electronic assemblies 10 (see FIGS. 3 and 5).

FIGS. 7-12 show schematic side views at different manufacturing stages for various example processes of forming stretchable electronic assemblies. FIGS. 7-12 show a single (top) sided panel process. However, it should be noted that these processes may be extended to include dual-sided and/or panel-level processes where one or both sides are utilized during fabrication of the stretchable electronic assemblies.

In some forms, the dielectric into which the meandering connectors 12 are embedded is not patterned (see, e.g., FIGS. 2-3). This configuration of the dielectric material requires that the dielectric material be elastic thereby placing some restrictions on the material that may be used in manufacturing the stretchable electronic assemblies 10.

In alternative forms, different methods may be used to pattern the dielectric film 19 so that in the region of the meandering conductors 12, the dielectric itself meanders while encapsulating the traces (see, e.g., FIGS. 4-6). One potential advantage of this configuration is that virtually any dielectric material may be used and the material may not have to be stretchable. In addition, this type of meandering conductive structure may increase the cyclical stretching reliability.

Figure 12:
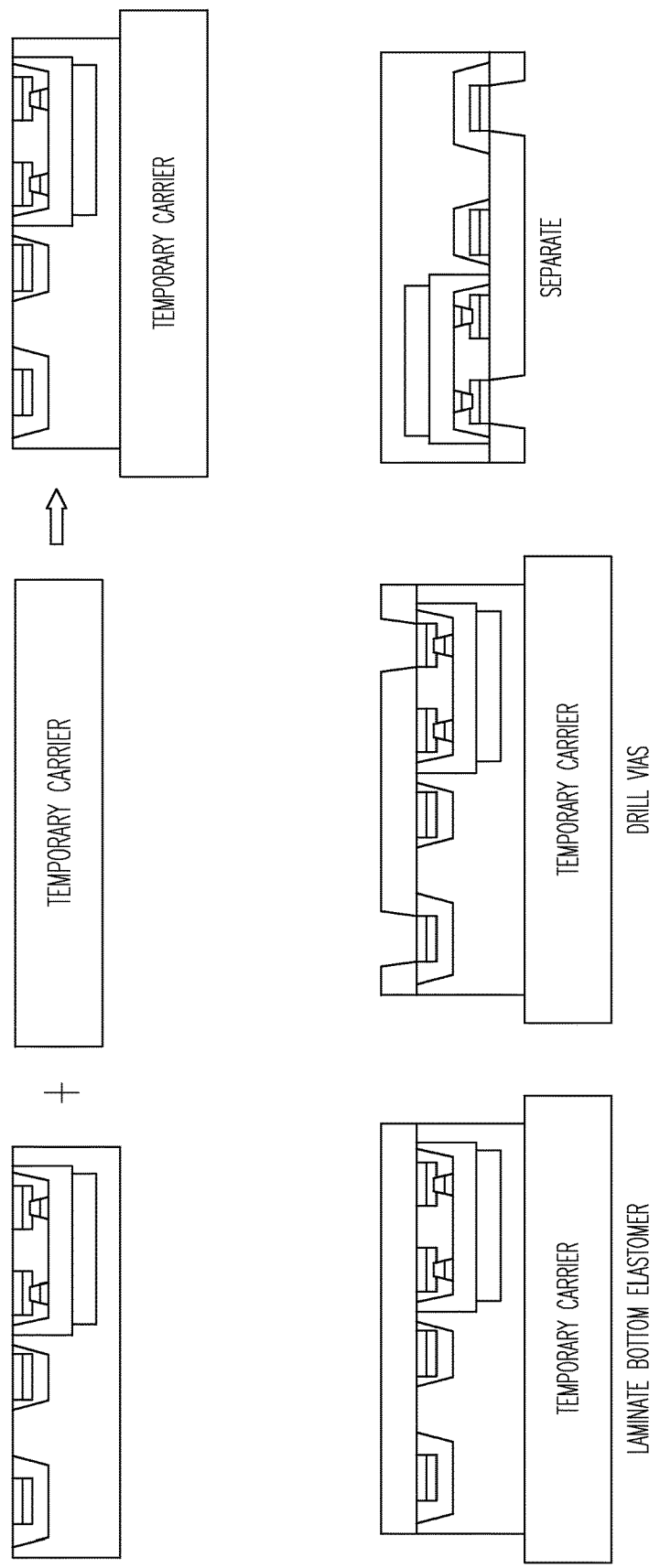
Figure 13:
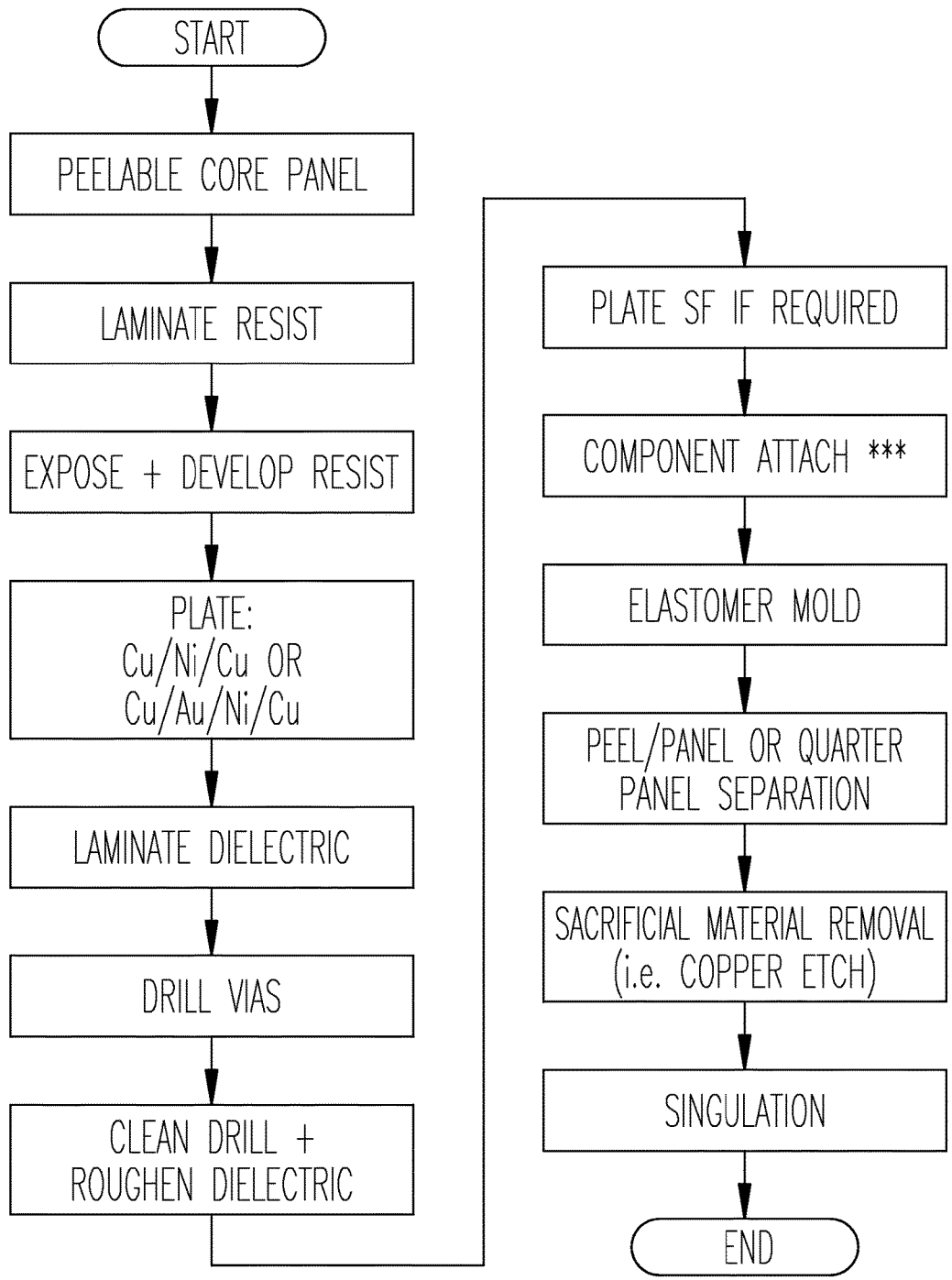
FIGS. 13-16 show different flow diagrams for various example processes of forming stretchable electronic assemblies.
Figure 14:
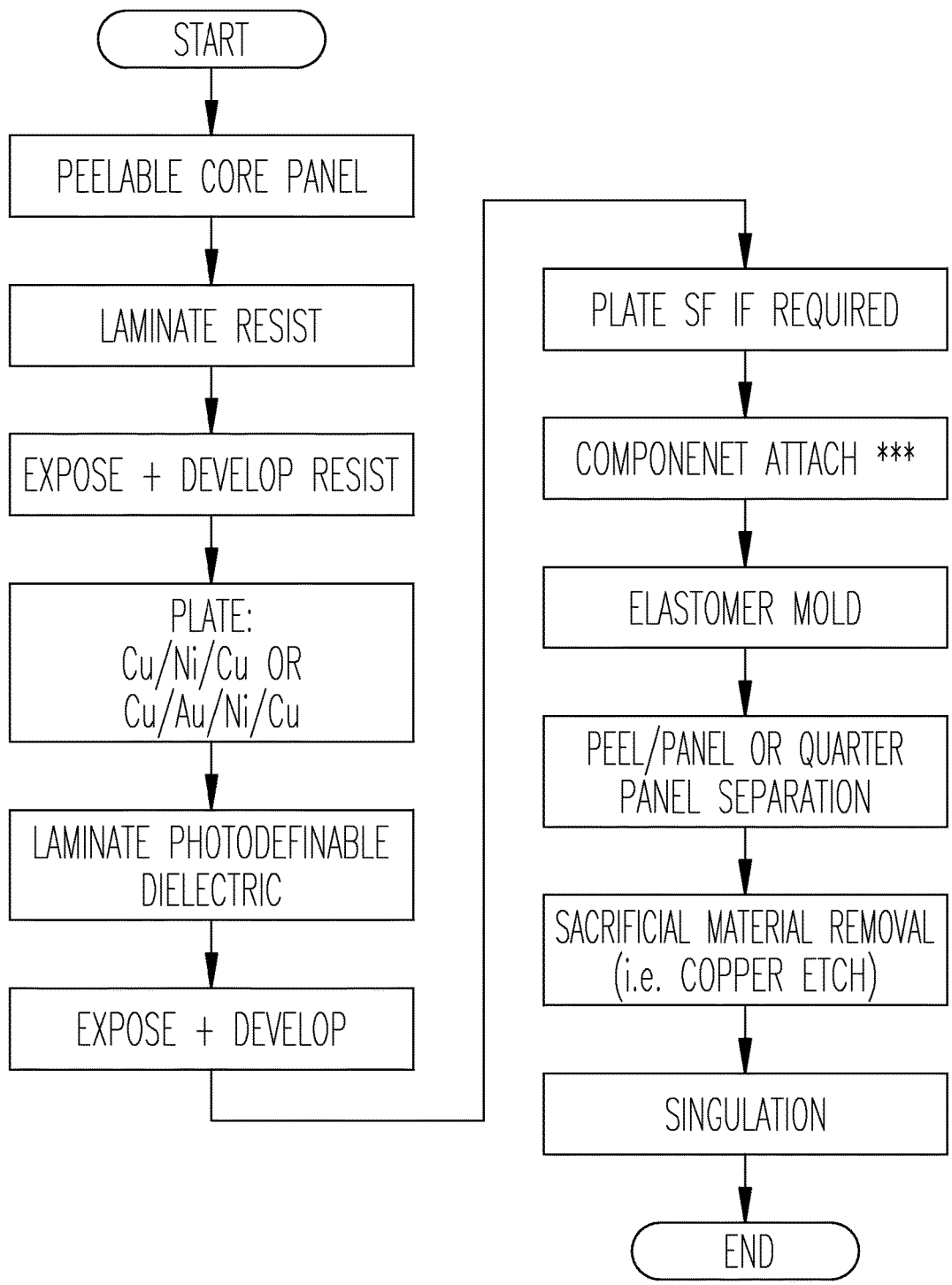
Figure 15:
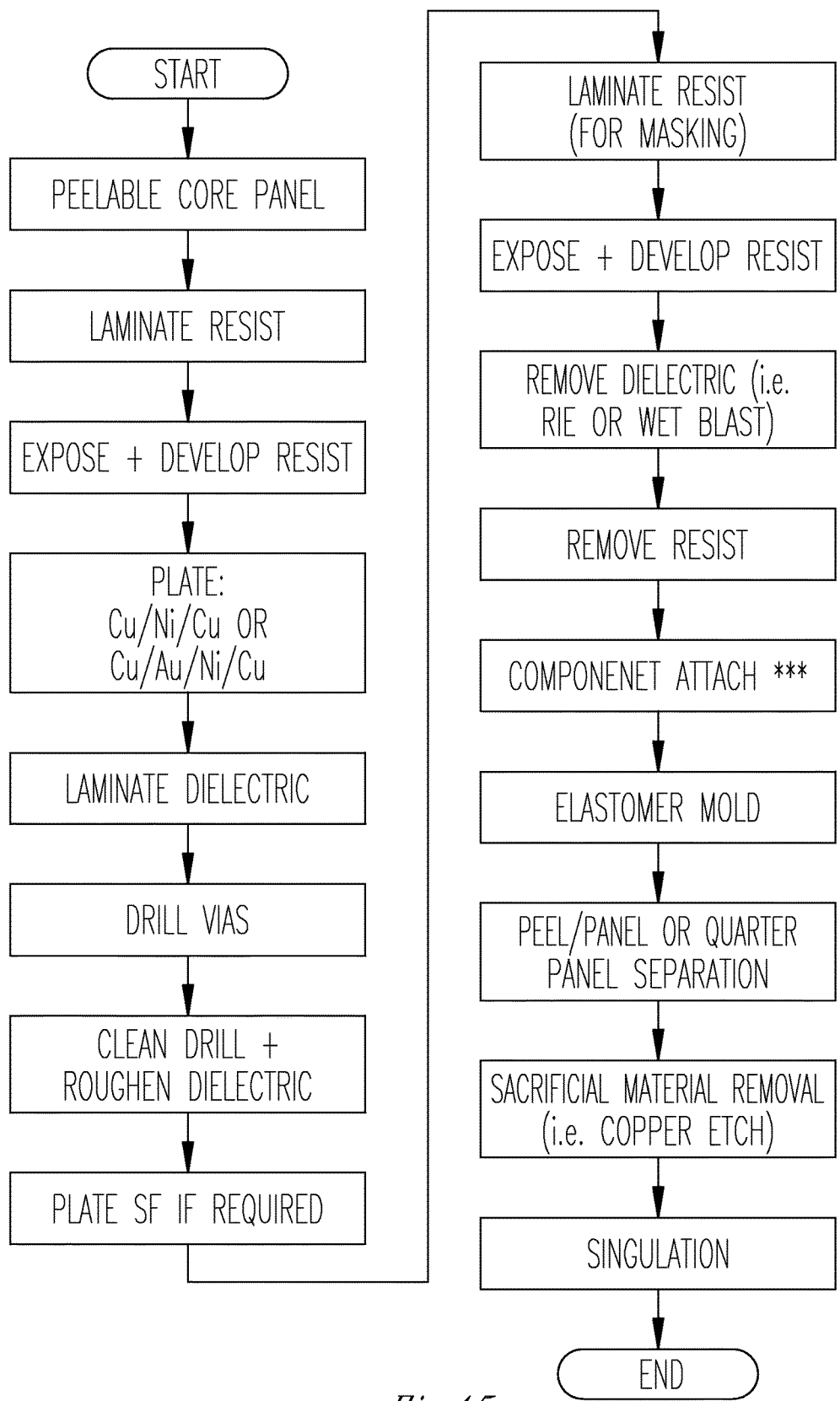
Figure 16:
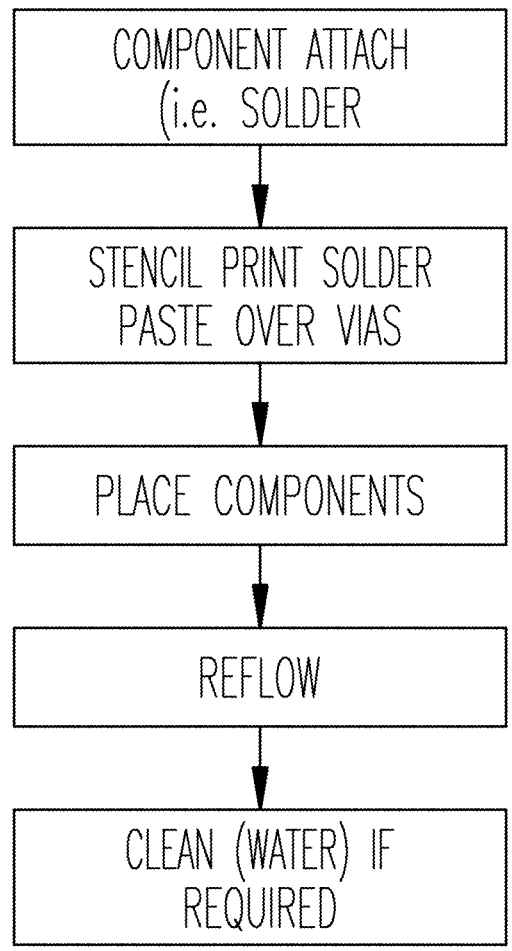

FIG. 12, illustrates that the processes may utilize a temporary carrier panel. The temporary carrier panel may have different configurations.

As an example, the temporary carrier panel may have two copper layers that are separated by a weak layer to permit easy separation when separating the stretchable electronic assemblies 10 from the temporary carrier panel. It should be noted that a variety of configurations for the temporary carrier panel are contemplated and will depend in part on the materials and manufacturing processes that are utilized to fabricate the stretchable electronic assemblies 10.

It should be noted that in all of the processes that are shown and described herein, individual units may be singulated from a wafer panel. In addition, the singulated units may be encapsulated and/or attached to other electronic assemblies or electronic packages.

Figure 11:
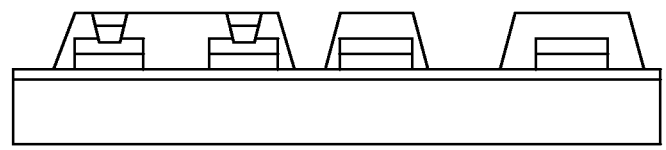
Figure 11:
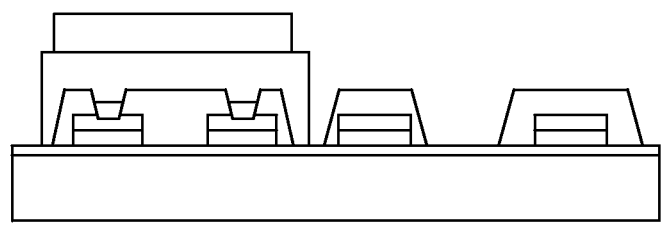
Figure 11:
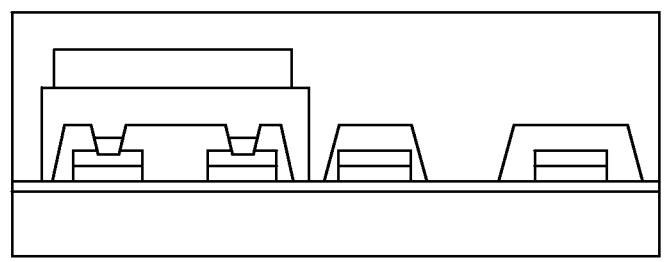
Figure 11:
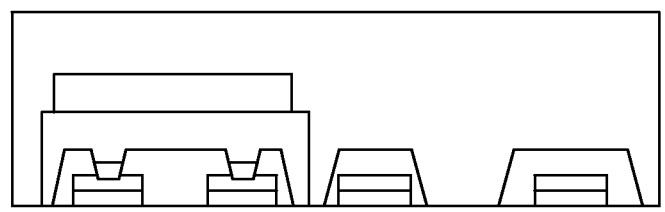

FIG. 12 shows additional steps or backside processing that may occur to the stretchable electronic assembly 10 shown in FIG. 11. As an example, an additional electronic component (not shown) may be added after peeling and chemical etching of a copper layer. Depending on the manufacturing processes and product requirements, the additional backside component may be attached at the same location or a different location. In addition, additional laminations and/or drilling steps are contemplated when attaching, or preparing to attach, an additional component to the example stretchable electronic assembly 10.

FIGS. 13-16 show different flow diagrams for the various example processes of forming different stretchable electronic assemblies shown in FIGS. 7-12. FIGS. 13-16 show the example process flows in greater detail.

It should be noted that the various example processes shown in FIGS. 7-12 and FIGS. 13-16 are merely examples. All of the illustrated processes and flow diagrams are merely examples and other processes, materials, components, configurations and attachment methods may be utilized. These example processes and flow diagrams should not be viewed as limiting the scope of the electronic assemblies 10 described herein.

Figure 17:
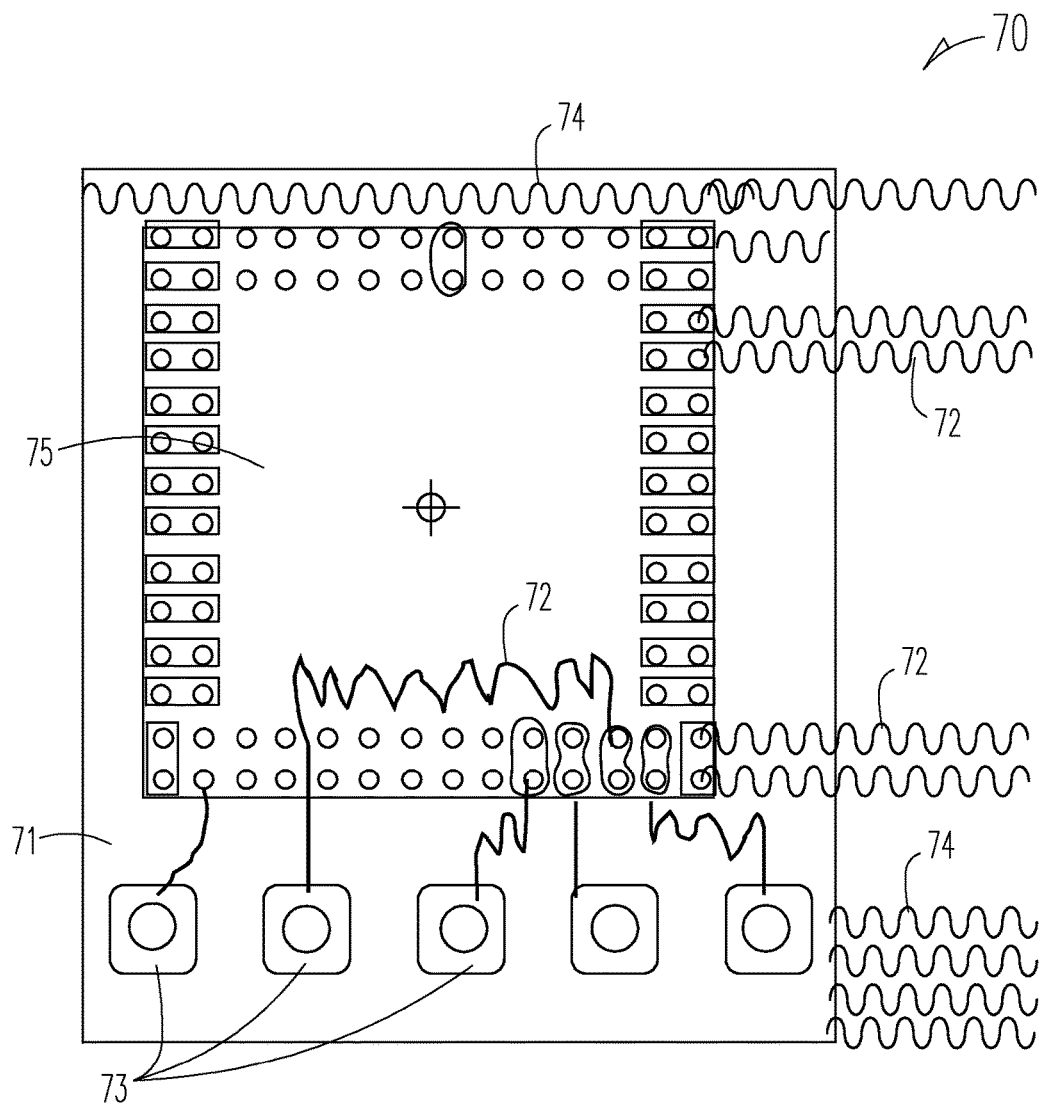
FIG. 17 is a schematic top view illustrating a portion of another example stretchable electronic assembly.

FIG. 17 is a schematic top view illustrating a portion of another example stretchable electronic assembly 70. The stretchable electronic assembly 70 includes a stretchable body 71 that includes electronic components 75.

The stretchable electronic assembly 70 further includes meandering conductors 72 that connect the electronic components 75 and a plurality of conductive pads 73 that are electrically connected to at least one of the electric components or some of the plurality of meandering conductors 72. The stretchable electronic assembly 70 further includes a plurality of members 74 that do not carry electric signals. The plurality of members 74 are within the stretchable body 71 to provide mechanical support to the stretchable electronic assembly 70.

In some forms, the plurality of members 74 are metal areas on the stretchable body 71. As an example, the metal areas may be traces.

In some forms, the member traces 74 may be meandering traces. As an example, the meandering traces may have a modified sinusoidal shape. In addition, the traces may be the same material as the plurality of meandering conductors.

It should be noted that the plurality of members 74 may be any type of member that is known now, or discovered in the future. The type of plurality of members 74 that is included in the stretchable electronic assembly 70 will depend in part on the manufacturing processes that are associated with fabricating the stretchable electronic assembly 70 as well as the application where the stretchable electronic assembly 70 is to be used (among other factors).

In some forms, the stretchable body 71 includes an upper surface and a lower surface. The meandering conductors 72 may be exposed from the lower surface of the stretchable body (and/or alternatively the upper surface 75 of the stretchable body 71). In some forms, the plurality of conductive pads 73 are exposed from the lower surface and the upper surface of the stretchable body 71.

The electronic components 75 may be any of the electronic components described above. The type of electronic components that are included in the stretchable electronic assembly 70 will depend in part on manufacturing considerations as well as the type of application where the stretchable electronic assembly 70 is to be used.

Figure 18:
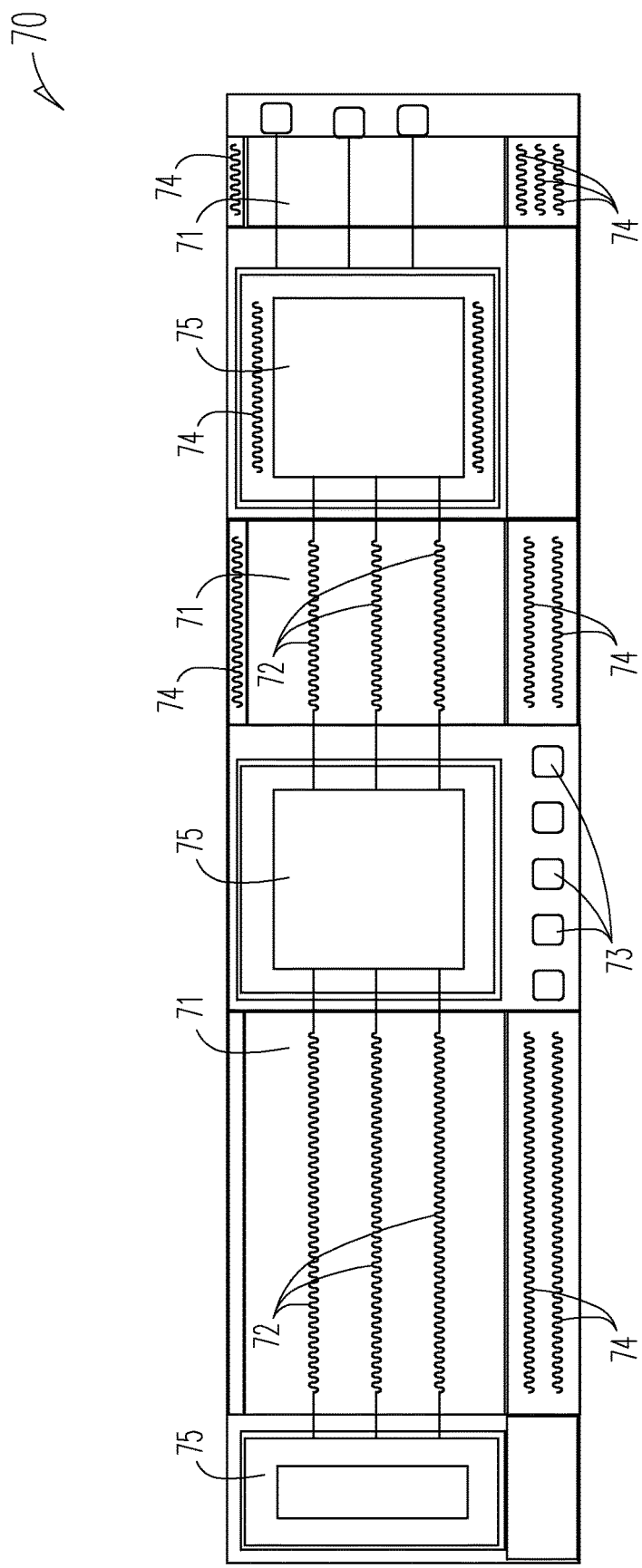
FIG. 18 is a schematic top view illustrating a more form of the example stretchable electronic assembly shown in FIG. 17.

FIG. 18 is a schematic top view illustrating a more elaborate form of the example stretchable electronic assembly 70 shown in FIG. 17. In the example form shown in FIG. 18, the electronic assembly 70 includes three electronic components 75 (of any type) that are at least partially connected by meandering conductors 72. In addition, the electronic assembly 70 includes multiple areas of meandering traces 74 on the stretchable (and rigid) sections of the electronic assembly 70 in order to provide support to the electronic assembly 70.

The stretchable electronic assemblies 10, 70 described herein may provide for physical separation between an input and/or display device in an application that is performed by the stretchable electronic assemblies 10, 70.

Figure 19:
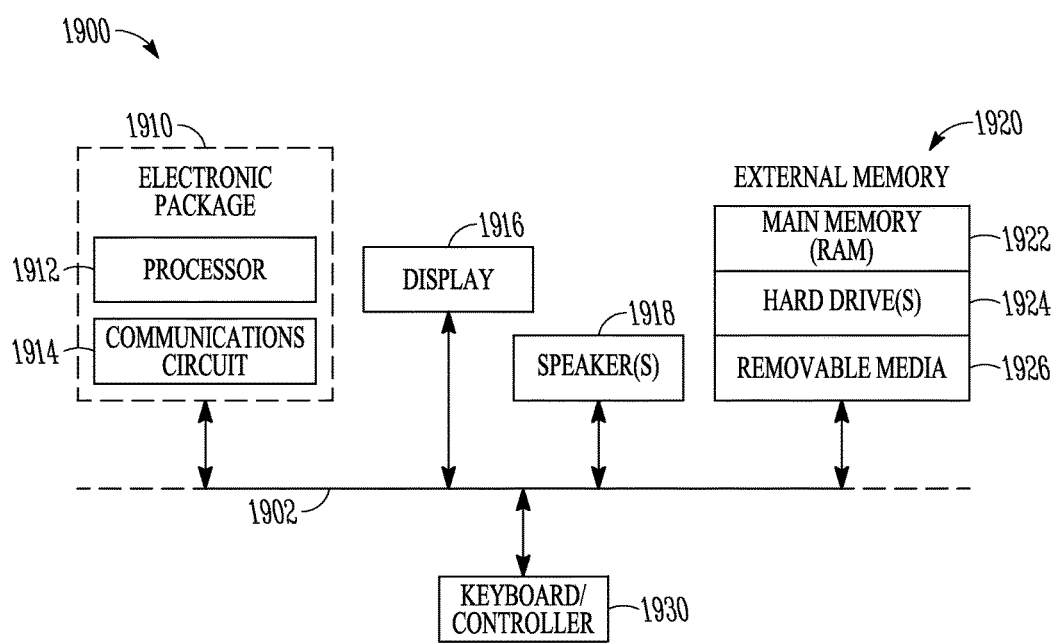
FIG. 19 is block diagram of an electronic apparatus that includes any of the stretchable electronic assemblies described herein.

FIG. 19 is a block diagram of an electronic apparatus 1900 incorporating at least one stretchable electronic assembly 10, 70 described herein. Electronic apparatus 1900 is merely one example of an electronic apparatus in which forms of the stretchable electronic assemblies 10, 70 described herein may be used.

Examples of an electronic apparatus 1900 include, but are not limited to, personal computers, tablet computers, mobile telephones, game devices, MP3 or other digital media players, etc. In this example, electronic apparatus 1900 comprises a data processing system that includes a system bus 1902 to couple the various components of the electronic apparatus 1900. System bus 1902 provides communications links among the various components of the electronic apparatus 1900 and may be implemented as a single bus, as a combination of busses, or in any other suitable manner.

An electronic apparatus 1900 as describe herein may be coupled to system bus 1902. The electronic apparatus 1900 may include any circuit or combination of circuits. In one embodiment, the electronic apparatus 1900 includes a processor 1912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 1900 are a custom circuit, an application-specific integrated circuit (ASIC), or the like, such as, for example, one or more circuits (such as a communications circuit 1914) for use in wireless devices like mobile telephones, tablet computers, laptop computers, two-way radios, and similar electronic systems. The IC can perform any other type of function.

The electronic apparatus 1900 may also include an external memory 1920, which in turn may include one or more memory elements suitable to the particular application, such as a main memory 1922 in the form of random access memory (RAM), one or more hard drives 1924, and/or one or more drives that handle removable media 1926 such as compact disks (CD), flash memory cards, digital video disk (DVD), and the like.

The electronic apparatus 1900 may also include a display device 1916, one or more speakers 1918, and a keyboard and/or controller 1930, which can include a mouse, trackball, touch pad, voice-recognition device, or any other device that permits a system user to input information into and receive information from the electronic apparatus 1900.

To better illustrate the wearable electronic assemblies 10, 20, 40, 70 disclosed herein, a non-limiting list of examples is provided herein:

Example 1 includes a stretchable electronic assembly. The stretchable electronic assembly includes a stretchable body that includes electronic components; a plurality of meandering conductors that connect the electronic components, wherein the plurality of meandering conductors are exposed from the stretchable body; a plurality of conductive pads that are electrically connected to at least one of the electronic components or some of the plurality of meandering conductors, wherein the plurality of conductive pads are exposed from the stretchable body.

Example 2 includes the stretchable electronic assembly of example 1, wherein the stretchable body includes an upper surface and a lower surface, wherein the plurality of meandering conductors are exposed from the lower surface of the stretchable body.

Example 3 includes the stretchable electronic assembly of any one of examples 1-2, wherein the stretchable body includes an upper surface and a lower surface, wherein the plurality of conductive pads are exposed from the lower surface of the stretchable body.

Example 4 includes the stretchable electronic assembly of any one of examples 1-3, wherein at least one of the electronic components is an electronic package.

Example 5 includes the stretchable electronic assembly of any one of the examples 1-4, wherein at least one of the electronic components is a sensor.

Example 6 includes the stretchable electronic assembly of any one of examples 1-5, wherein at least one of the electronic components is a power source.

Example 7 includes the stretchable electronic assembly of any one of examples 1-6, wherein the plurality of meandering conductors have a modified sinusoidal shape.

Example 8 includes the stretchable electronic assembly of any one of examples 1-7, wherein at least one of the electronic components sends wireless signals.

Example 9 includes the stretchable electronic assembly of any one of examples 1-8, and further including a textile, wherein the stretchable body is attached to the textile.

Example 10 includes a stretchable electronic assembly. The stretchable electronic assembly includes a stretchable body that includes electronic components; a plurality of meandering conductors that connect the electronic components; a plurality of conductive pads that are electrically connected to at least one of the electronic components or some of the plurality of meandering conductors; and a plurality of members that do not carry electrical signals, wherein the plurality of members are within the stretchable body to provide mechanical support to the stretchable electronic assembly.

Example 11 includes the wearable electronic assembly of example 10, wherein the plurality of members are metal areas on the stretchable body.

Example 12 includes the stretchable electronic assembly of any one of examples 10-11, wherein the metal areas are traces.

Example 13 includes the stretchable electronic assembly of any one of examples 10-12, wherein the traces are meandering traces.

Example 14 includes the stretchable electronic assembly of any one of examples 10-13, wherein the meandering traces have a modified sinusoidal shape.

Example 15 includes the stretchable electronic assembly of any one of examples 10-14, wherein the traces are the same material as the plurality of meandering conductors.

Example 16 includes the stretchable electronic assembly of any one of examples 10-15, wherein the stretchable body includes an upper surface and a lower surface, wherein the plurality of meandering conductors are exposed from the lower surface of the stretchable body, and wherein the stretchable body includes an upper surface and a lower surface, wherein the plurality of conductive pads are exposed from the lower surface of the stretchable body.

Example 17 includes the stretchable electronic assembly of any one of examples 11-16, wherein at least one of the electronic components is an electronic package.

Example 18 includes a stretchable electronic assembly. The stretchable electronic assembly includes a stretchable body that includes a plurality of electronic components, wherein the plurality of electronic components includes at least one of a die, a sensor, a power source or a passive device; a plurality of meandering conductors that connect the electronic components, wherein the plurality of meandering conductors are exposed from the stretchable body, wherein the plurality of meandering conductors are traces that have a sinusoidal shape; and a plurality of conductive pads that are electrically connected to at least one of the electronic components or some of the plurality of meandering conductors, wherein the stretchable body includes an upper surface and a lower surface, wherein the plurality of meandering conductors are exposed from the lower surface of the stretchable body and the plurality of conductive pads are exposed from the lower surface of the stretchable body.

Example 19 includes the stretchable electronic assembly of example 18, wherein the plurality of members are within the stretchable body to provide mechanical support to the electronic assembly, wherein the plurality of members are meandering traces that have a modified sinusoidal shape.

Example 20 includes the stretchable electronic assembly of any of examples 18-19, and further including a textile, wherein the stretchable body is attached to the textile.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A stretchable electronic assembly, comprising:
   a stretchable body that includes electronic components;
   a plurality of meandering conductors that connect the electronic components, wherein the plurality of meandering conductors are exposed from the stretchable body;
   a plurality of conductive pads that are electrically connected to at least one of the electronic components or some of the plurality of meandering conductors, wherein the plurality of conductive pads are exposed from the stretchable body; and
   a plurality of metal members that do not carry electrical signals, wherein the plurality of metal members form part of the stretchable body to provide mechanical support to the stretchable electronic assembly.

2. The stretchable electronic assembly of claim 1, wherein the stretchable body includes an upper surface and a lower surface, wherein the plurality of meandering conductors are exposed from the lower surface of the stretchable body.

3. The stretchable electronic assembly of claim 1, wherein the stretchable body includes an upper surface and a lower surface, wherein the plurality of conductive pads are exposed from the lower surface of the stretchable body.

4. The stretchable electronic assembly of claim 1, wherein at least one of the electronic components is an electronic package.

5. The stretchable electronic assembly of claim 1, wherein at least one of the electronic components is a sensor.

6. The stretchable electronic assembly of claims 1, wherein at least one of the electronic components is a power source.

7. The stretchable electronic assembly of claim 1, wherein the plurality of meandering conductors have a modified sinusoidal shape.

8. The stretchable electronic assembly of claim 1, wherein at least one of the electronic components sends wireless signals.

9. The stretchable electronic assembly of claim 1, further comprising a textile, wherein the stretchable body is attached to the textile.

10. A stretchable electronic assembly, comprising:
    a stretchable body that includes electronic components;
    a plurality of meandering conductors that connect the electronic components;
    a plurality of conductive pads that are electrically connected to at least one of the electronic components or some of the plurality of meandering conductors; and
    a plurality of members that do not carry electrical signals, wherein the plurality of members form part of the stretchable body to provide mechanical support to the stretchable electronic assembly, wherein the plurality of members are metal areas that form part of the stretchable body.

11. The stretchable electronic assembly of claim 10, wherein the metal areas are traces.

12. The stretchable electronic assembly of claim 11, wherein the traces are meandering traces.

13. The stretchable electronic assembly of claim 12, wherein the meandering traces have a modified sinusoidal shape.

14. The stretchable electronic assembly of claim 13, wherein the traces are the same material as the plurality of meandering conductors.

15. The stretchable electronic assembly of claim 10, wherein the stretchable body includes an upper surface and a lower surface, wherein the plurality of meandering conductors are exposed from the lower surface of the stretchable body, and wherein the plurality of conductive pads are exposed from the lower surface of the stretchable body.

16. The stretchable electronic assembly of claim 10, wherein at least one of the electronic components is an electronic package.

17. A stretchable electronic assembly, comprising:
    a stretchable body that includes a plurality of electronic components, wherein the plurality of electronic components includes at least one of a die, a sensor, a power source or a passive device;
    a plurality of meandering conductors that connect the electronic components, wherein the plurality of meandering conductors are exposed from the stretchable body, wherein the plurality of meandering conductors are traces that have a sinusoidal shape; and
    a plurality of conductive pads that are electrically connected to at least one of the electronic components or some of the plurality of meandering conductors, wherein the stretchable body includes an upper surface and a lower surface, wherein the plurality of meandering conductors are exposed from the lower surface of the stretchable body and the plurality of conductive pads are exposed from the lower surface of the stretchable body; and a plurality of members that do not carry electrical signals, wherein the plurality of members are within the stretchable body to provide mechanical support to the electronic assembly, wherein the plurality of members are meandering traces that have a modified sinusoidal shape.

18. The stretchable electronic assembly of claim 17, further comprising a textile, wherein the stretchable body is attached to the textile.

* * * * *